United States Patent [19]

Jason

[11] Patent Number: 4,881,043

[45] Date of Patent: Nov. 14, 1989

[54] VARIABLE GAIN TRANSCONDUCTANCE AMPLIFIER AND VARIABLE BANDWIDTH FILTER

[75] Inventor: Barry L. Jason, Bedford, Tex.

[73] Assignee: Motorola, Inc., Schaumburg, Ill.

[21] Appl. No.: 242,998

[22] Filed: Sep. 12, 1988

[51] Int. Cl.$^4$ ............................................. H03F 3/45
[52] U.S. Cl. ..................................... 330/252; 330/107; 330/294; 330/306
[58] Field of Search ............... 330/252, 257, 303, 305, 330/306, 107, 294; 307/520; 328/167

[56] References Cited

U.S. PATENT DOCUMENTS 4,288,754 9/1981 Okada et al. ..................... 330/294 X

OTHER PUBLICATIONS

Voorman et al, "Integration of Analog Filters in a Bipolar Process" *IEEE J. of Solid-State Circuits*, vol. SC-17, No. 4, Aug. 1982, pp. 713-722.

*Primary Examiner*—James B. Mullins
*Attorney, Agent, or Firm*—Steven G. Parmelee

[57] ABSTRACT

A variable gain transconductance amplifier wherein complimentary input followers are used in conjunction with the multiplier to provide a high input impedance. A pair of multiplier input devices are embedded in the input followers to reduce the supply voltage used by the multiplier and to improve signal handling capability while reducing the supply voltage required. Further, these variable gain transconductance amplifiers are used in active filters to provide adjustment of the bandwidth without affecting the center frequency.

9 Claims, 4 Drawing Sheets

VARIABLE GAIN TRANSCONDUCTANCE AMPLIFIER AND VARIABLE BANDWIDTH FILTER

BACKGROUND OF THE INVENTION

This invention pertains to transconductance amplifiers and more particularly to variable gain transconductance amplifiers using a low supply voltage while operating with high swing input signals, and use of the amplifier in active filters.

The concept of transconductance amplifiers has been known for many years. The major limitation of existing transconductance amplifiers is the restricted differential input voltage swing required to maintain linearity. All prior art transconductance amplifiers have significantly higher supply voltages or reduced signal handling capabilities at lower supply voltages. Some efforts have been expanded to solve this problem, chiefly consisting of using voltage attenuators and buffers at the inputs of existing transconductance amplifiers. This technique can be used to obtain reasonable signal swings in existing transconductance amplifiers. Although such circuits are useful, a rather high price is paid for these modifications. First, the circuit requires many more components. Second, the finite bandwidth of the amplifiers will limit the frequency response of the transconductance amplifier structures. Finally, the attenuation of the input signal to the transconductance amplifier causes a serious loss in dynamic range.

Also, the use of transconductance amplifiers as components of complex filters is known in the art. However, there are no practical prior art filters with an adjustable bandwidth wherein the center frequency is not effected by the adjustment. Generally, to accomplish this task is a prohibitively difficult problem. For example, the technique of mixing a signal down to baseband, lowpass filtering using a programmable lowpass filter, and mixing back up to the desired frequency would accomplish this result. However, this approach would have a high system complexity and would generate undesired mixer spurious responses.

SUMMARY OF THE INVENTION

It is an object of this invention to provide a new and improved variable gain transconductance amplifier and adjustable bandwidth active filter utilizing the amplifier.

It is a further object of the present invention to provide a new and improved variable gain transconductance amplifier which is capable of operating on a relatively high swing input signal utilizing a relatively low supply voltage.

It is a further object of the present invention to provide an adjustable active filter wherein the adjustments have substantially no effect on the center frequency of the filter.

These and other objects of this invention are realized in a low supply voltage, high swing input signal, variable gain transconductance amplifier including a pair of complimentary input follower circuits, an element coupled to each of the follower circuits to provide a signal current in the element in response to a differential input voltage applied to the complimentary inputs, the signal current in the element producing differential currents in each of the follower circuits, and a multiplier having a pair of input devices, one each coupled into and forming a common component with each of said follower circuits, said input devices sensing the differential current flowing in said follower circuits.

These and other objects further being realized in an active bandpass filter with variable bandwidth including first, second, and third variable gain transconductance amplifiers each having differential inputs and an output, a first junction coupled to the outputs of the first and second amplifiers and to a selected one of the differential inputs of said third amplifier, a second junction coupled to the output of the third amplifier and to the opposite differential input of the second amplifier, the other differential inputs of the second and third amplifiers being coupled to a reference potential, and first and second capacitors each having a terminal coupled to the first and second junctions, respectively, and each having a second terminal coupled to the reference potential.

BRIEF DESCRIPTION OF THE DRAWINGS

Referring to the drawings.

DESCRIPTION OF THE PREFERRED EMBODIMENTS

Figure 1:
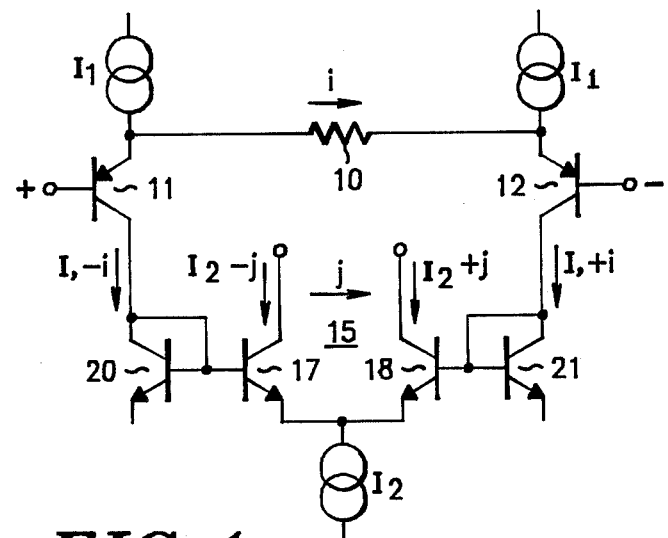
FIG. 1 is a simplified transconductance amplifier illustrated for explaining the transconductance principle.

The basic principle of transconductance amplifiers is described in conjunction with the simplified schematic diagram in FIG. 1. It will be understood that, in general, these circuits are integrated. An integrated conductor, or transconductance element, 10 (having a value $G_K$) is connected between the emitters of a pair of transistors 11 and 12, the bases of which form differential inputs to the amplifier. A multiplier 15 includes a differential pair of transistors 17 and 18 having common connected emitters, and a pair of transistors 20 and 21 having the bases connected to the collectors and connected to the bases of transistors 17 and 18, respectively. The collectors of transistors 20 and 21 are connected to the collectors of transistors 11 and 12, respectively. Transistors 11 and 12 are connected to a source of current $I_1$ and transistors 17 and 18 are connected to a source of current $I_2$.

A differential input voltage "v" between the bases of transistors 11 and 12 yields a signal current $i = G_K V$ in element 10. This current is scaled. The collector currents of input transistors 11 and 12 are $I_1 - i$ and $I_1 + i$, which currents are supplied to multiplier 15. The multiplication is based on addition and subtraction of base-emitter voltages, which corresponds to multiplication and division of collector currents, respectively, because of the logarithmic characteristics of bipolar transistors. Let the collector currents of output transistors 17 and 18 be $I_2 - j$ and $I_2 + j$, respectively. Then $(I_1 - i)/(I_2 - j) \cdot (I_2 + j)/(I_2 + i) = 1$, provided that multiplier transistors 17, 20 and 18, 21 are pairwise identical and they are at the same temperature. The output signal current $j = (I_2/I_1)i$. The effective value of the transconductance is $G_K$ eff. $= j/v = (I_2/I_1)G_K$.

Figure 2:
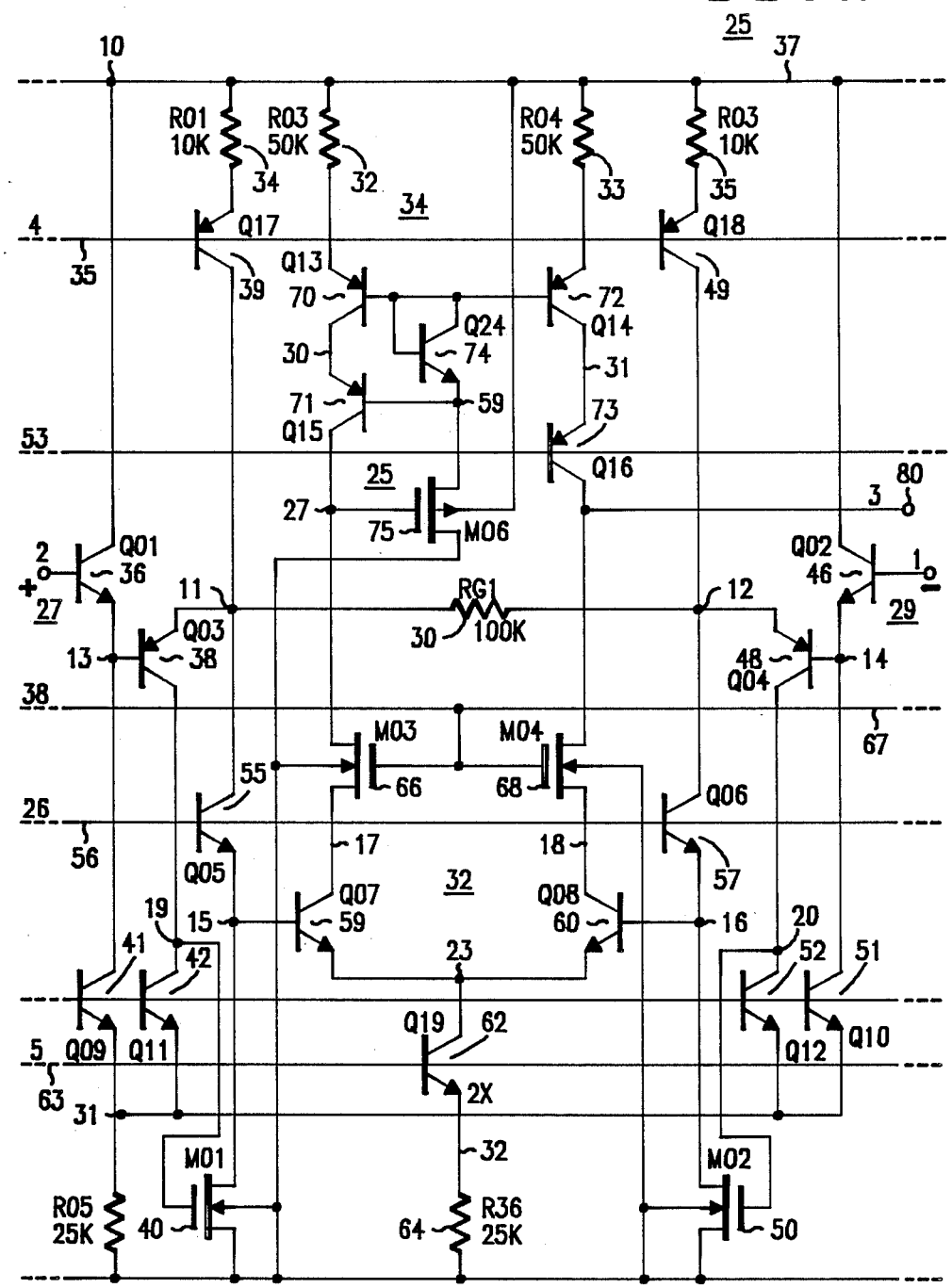
FIG. 2 is a schematic diagram of a transconductance amplifier embodying the present invention.

Referring specifically to FIG. 2, a transconductance amplifier 25 embodying the present invention is illustrated schematically. Amplifier 25 includes input follower circuits 27 and 29, a transconductance element 30, a multiplier 32, and an output circuit 34. Input follower 27 includes two bipolar transistors 36 and 38 and a field effect transistor (FET) 40. The base of transistor 36 forms a first differential input and the emitter is connected to the base of transistor 38 to provide a follower action. The emitter of transistor 38 is connected to one terminal of element 30 and to a first source of current (in this embodiment a 20 microamp supply) through a current mirror 39. Current mirror 39 is a transistor having the emitter coupled to a power source terminal 37 and the base coupled by a lead 35 to the 20 microamp supply for mirroring a 20 microamp current from the collector into input follower circuit 27. The emitter of transistor 36 and the collector of transistor 38 are coupled to a very small bias current through current mirrors 41 and 42, respectively. The collector of transistor 38 is also connected to the gate of FET 40, which is in turn connected to multiplier 32. The collector of transistor 36 is connected to the power supply terminal 37.

Input follower 29 includes a pair of transistors 46 and 48 and an FET 50 connected to each other and to element 30 as described above. Transistor 48 is also coupled to the first source of current through a current mirror 49 and transistors 46 and 48 are coupled to very small bias currents through current mirrors 51 and 52, as described above. The base of transistor 46 forms the second differential input for the amplifier.

Multiplier 32 includes four transistors 55, 57, 59, and 60. Transistors 55 and 57 are input devices having the bases connected together through a common line 56, which supplies a voltage to bias multiplier 32 into its operating region. The collectors of transistors 55 and 57 are connected to opposite sides of element 30 and the emitters are coupled to a reference potential 65, which in this embodiment is ground or the most negative supply, through FETs 40 and 50, respectively. Thus, transistors 55 and 57 are embedded in and form a common component with input followers 27 and 29, respectively. Transistors 59 and 60 form a differential pair with common connected emitters, which emitters are coupled to reference potential 65 through a current mirror 62. Current mirror 62 is a transistor having the emitter coupled to reference potential 65 through a resistor 64 and the base coupled by a lead 63 to a second source of bias current (in this embodiment approximately 4 microamps) for mirroring the 4 microamps into the multiplier 32 from the collector thereof. The collectors of transistors 59 and 60 are coupled through a pair of FETs 66 and 68, respectively, to the output circuit 34. The gates of FETs 66 and 68 are controlled by a bias voltage on common lead 67.

Output circuit 34 is a current mirror for converting the differential output of multiplier 32 to a single-ended output and includes five transistors 70 through 74 and an FET 75. Transistors 70 and 71 are coupled in series between power supply terminal 37 and the drain of FET 66. Similarly, transistors 72 and 73 are coupled in series between power supply terminal 37 and the drain of FET 68. The bases of transistors 70 and 72 are connected together and to the base and collector of transistor 74. The emitter of transistor 74 is connected to the base of transistor 71 and to the source of FET 75, the drain of which is connected to reference potential 65. The gate of FET 75 is connected to the collector of transistor 71. The collector of transistor 73 has a terminal 80 connected thereto, which when connected to drain of FET 68, serves as the single-ended output of transconductance amplifier 25.

Figure 3:
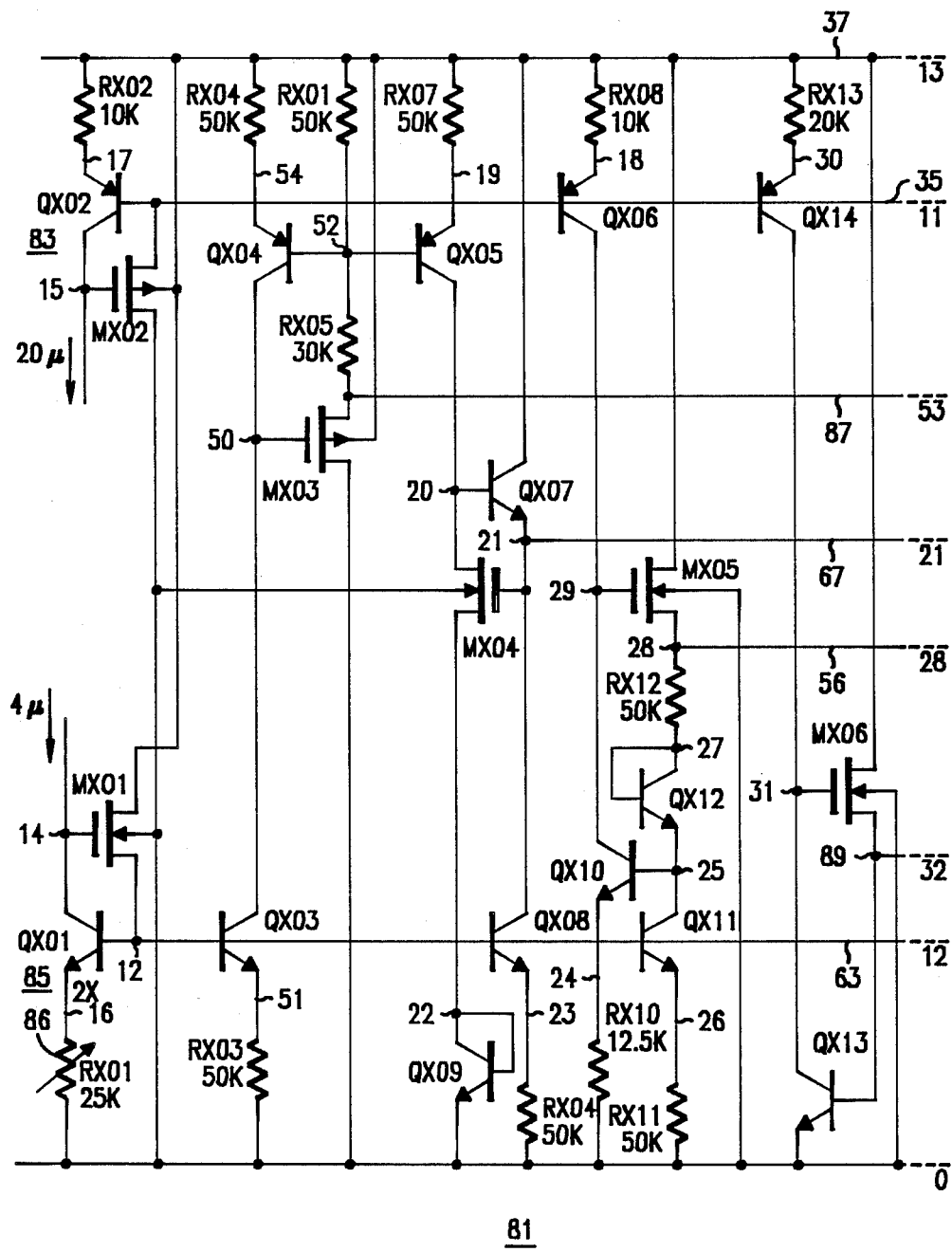
FIG. 3 is a schematic diagram of a bias cell for use with the transconductance amplifier of FIG. 2.

Referring to FIG. 3, a bias cell 81 is illustrated schematically, which bias cell is designed to operate in conjunction with one or more transconductance amplifiers 25. Bias cell 81 includes the first source of bias current, designated 83, which is coupled to current mirrors 39 and 49 by lead 35 and the second source of bias current, designated 85, which is coupled to the current mirror 62 by lead 63. The ratio of the first source 83 to the second source 85 sets the transconductance gain for each of the transconductance amplifiers 25 coupled thereto. First source 83 is chosen to be sufficiently large (approximately 20 microamps in this embodiment) so that the voltage swing on the input of transconductance amplifier 25 remains in the linear region. In normal operation, first source 83 is held fixed in order to maintain its input voltage range, and second source 85 is adjusted to achieve a variable multiplication factor and, therefore, a variable gain for transconductance amplifier 25. Second source 85 includes a transistor 84 and a variable resistor 86 which may be utilized to vary the current for a simplified circuit or a more complex and stable circuit may be included in the circuit with transistor 84. Since variable current sources are not the subject of this invention, the simplified circuit including variable resistor 86 connected in the emitter circuit of transistor 84 is illustrated. A lead 87 supplies a bias to the base of output transistor 73 of output circuit 34, for biasing transistor 73 into an output mode when power is applied to the circuit and second bias source 85 is operating correctly. Similarly, bias voltages are supplied to input transistors 55 and 57 by lead 56 and to FETs 66 and 68 by lead 67. These biases are again mirrored from sources 83 and 85. A lead 89, which is coupled to a source of current mirrored from first source 83, is connected to the bases of transistors 41, 42 and 51, 52 so that these transistors mirror the very small current flowing in the circuit of bias cell 81.

In the operation of transconductance amplifier 25, the differential voltage appearing between the bases of transistors 36 and 46 is replicated by follower circuits 27 and 29 and appears across element 30. The differential voltage across element 30 causes a current to flow therethrough, which in turn causes an increase in current in one of the followers 27 or 29 and a complimentary decrease in the other follower circuit. This differential current is sensed by input devices 55 and 57 of multiplier 32 and multiplier 32 scales the differential current by the ratio of the bias currents from the first and second sources. The fact that input devices 55 and 57 of multiplier 32 are embedded in input followers 27 and 29, respectively, is very significant in improving the signal handling capability of transconductance amplifier 25 because no valuable supply voltage is consumed by multiplier 32. This is a major technique employed to allow operation from a limited supply voltage (in this embodiment, 5 volts) while still maintaining adequate signal handling capability. FETs 66 and 68 are cascode devices to raise the impedance at the output of multiplier 32 and current mirror 34 performs the function of differential to single-ended conversion. Input followers 27 and 29 provide a very high input impedance, which is required in integrated filter applications where the capacitance of the filter must be made small to minimize IC area and the resulting impedance level of the filter must then be made correspondingly high.

Figure 4:
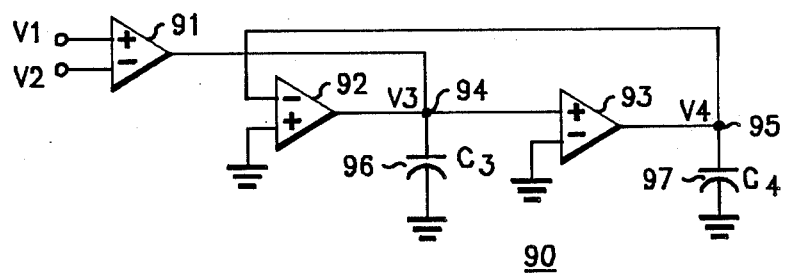
FIG. 4 is a schematic diagram of an active bandpass filter embodying the present invention.

FIG. 4 illustrates a schematic diagram of an active bandpass filter 90 embodying the present invention. Filter 90 includes three transconductance amplifiers 91, 92, and 93, each of which may be, for example, similar to amplifier 25 of FIG. 2. The outputs of amplifiers 91 and 92 are connected to a first junction 94, which is connected to the positive differential input of amplifier 93. The output of amplifier 93 is connected to a second junction 95, which is connected to the negative differential input of amplifier 92. A first capacitor 96 is connected between junction 94 and the reference potential. A second capacitor 97 is connected between junction 95 and the reference potential. The positive differential input of amplifier 92 and the negative differential input of amplifier 93 are both connected to the reference potential.

The following equations can be derived from active filter 90 of FIG. 4 or LC transformed filter implementations thereof.

$$V_4 = V_3 G_4 \left( \frac{1}{SC_4} \right)$$

$$V_3 = [-V_4 G_3 + (V_1 - V_2) G_A] \frac{1}{SC_3} \quad (1)$$

$$V_3 = -V_3 G_3 G_4 \left( \frac{1}{S^2 C_3 C_4} \right) + (V_1 - V_2) \frac{G_A}{SC_3}$$

$$V_3 \left( 1 + \frac{G_3 G_4}{S^2 C_3 C_4} \right) = (V_1 - V_2) \frac{G_A}{SC_3}$$

$$\frac{V_3}{V_1 - V_2} = \frac{S\left(\frac{G_A}{C_3}\right)}{S^2 + \frac{G_3 G_4}{C_3 C_4}}$$

When $V_2 = V_3$ $$\frac{V_3}{V_1} = \frac{S\left(\frac{G_A}{C_3}\right)}{S^2 + S\left(\frac{G_A}{C_3}\right) + \frac{G_3 G_4}{C_3 C_4}} \quad (2)$$

Equation (1) is the basic differential input, active implementation of an LC bandpass transformed filter simulation of active filter 90. The key feature of this implementation is that the gain of transconductance amplifier 91 ($G_A$), appears only in the numerator of the transfer function (sets the gain) and does not affect the resonating frequency. Thus, coupling between adjacent resonator cells, or active filters 90, can be independently controlled from the resonator center frequency. Equation (2) results from connecting $V_2$ to $V_3$ and provides a lossy stage required for the single-ended termination of the higher order active filter illustrated schematically in FIG. 5.

Figure 5:
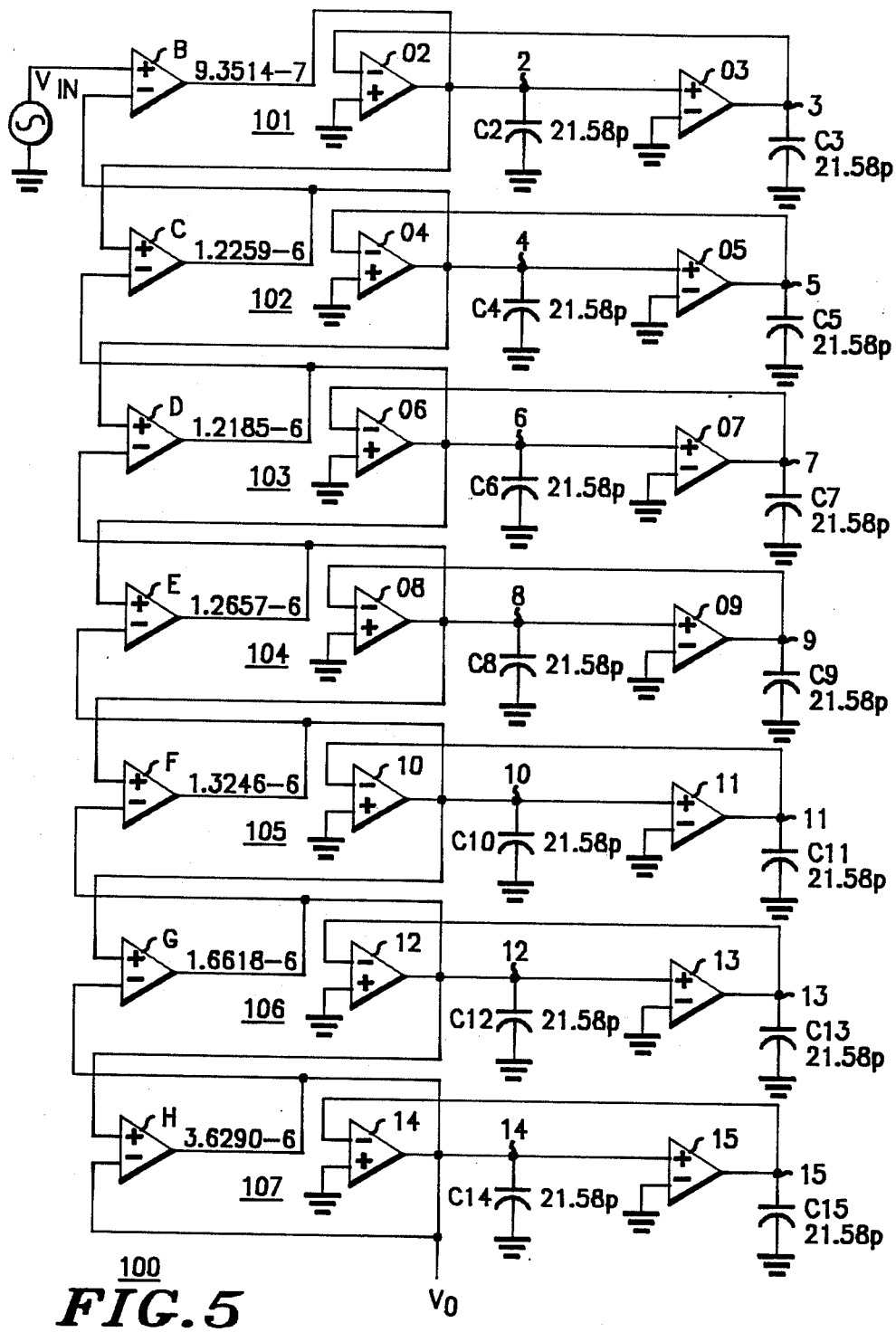
FIG. 5 is a schematic diagram of an active bandpass higher order filter embodying the present invention.

Referring specifically to FIG. 5, seven resonator cells 101 through 107, similar to active filter 90 and including transconductance amplifiers 110 through 130, are interconnected to provide a seventh order bandpass filter 100. The positive differential input of cell 101 is connected to receive the input signal to be filtered. The negative differential input of cell 101 and of cells 102 through 106 are connected to the first junction (same as junction 94 of FIG. 4) of the following cell 102 through 107, respectively. Also, the positive differential input of each of cells 102 through 107 is connected to the first junction of the previous cell 101 through 106, respectively. The negative differential input of cell 107 is connected to the first junction of cell 107, to provide the single-ended termination specified by equation (2).

By implementing each of the cells 101 through 107 from a transform of an LC bandpass filter, it can be verified mathematically that the resonating frequency of each of the cells is at the desired center frequency of the filter. The only difference between resonators in an LC bandpass filter is the actual values of the LC elements (all resonators have the same L-C product). The relative values of the L and C elements themselves determine the coupling between adjacent cells, and the bandwidth of the filter. Because of the interaction of the LC elements, attempts to adjust the bandwidth must result in an adjustment of all of the elements in the filter. However, unlike the LC equivalent, the transconductance amplifier implementation can be made with identical element values in the resonators, and the coupling adjusted by setting $G_A$, which does not affect the center frequency. Thus, the adjustment of the bandwidth of filter 100 is made simply by adjusting all of the $G_A$'s of cells 101 through 107 by the same factor. This can be accomplished, for example, by connecting transconductance amplifiers 110 through 116 of cells 101 through 107 to a first bias cell (bias cell 81 of FIG. 3), while all the remaining transconductance amplifiers 117 through 130 of cells 101 through 107 are connected to a second bias cell, similar to the first bias cell. The circuitry of the first bias cell provides the appropriate bias voltages for the various nodes which are common among all of transconductance amplifiers 110 through 116, while the circuitry of the second bias cell provides the appropriate bias voltages for the various nodes which are common among all of the transconductance amplifiers 117 through 130. The ratio of the current (20 microamps) from the first source 83 to the current (4 microamps) from the second source 85 sets the transconductance gain for each of the transconductance amplifiers connected to that bias cell.

Thus, a transconductance amplifier has been shown and described which operates with a relatively large input and output voltage swing while requiring a relatively low supply voltage (approximately 5 volts). Further, the amplifier is relatively simple to produce in integrated form. The transconductance amplifier is uniquely adapted to be used in real time integrated filtering applications. One such application is illustrated and described, wherein a seventh order, active filter is contructed using only capacitors, and transconductance amplifiers. Further, this active filter can be fully integrated in a BiMOS process. A bias cell is also provided. The common bias nodes generated by the bias cell are illustrated as horizontal lines continuing completely through the schematic of the transconductance amplifier as they would actually occur in an IC layout when interconnecting several transconductance amplifiers.

While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

What I claim is:

1. An active band pass filter with variable bandwidth comprising:
   first, second, and third variable gain transconductance amplifiers each having at least first and second differential inputs and an output;
   a first junction coupled to the output of said first and second amplifier and to a first selected one of the differential input of said third amplifier;
   a second junction, coupled to the output of said third amplifier and to the second differential input of said second amplifier, the first differential input terminal of said second and the second differential input of said third amplifier being coupled to a reference potential;
   first and second capacitors each having a terminal coupled to said first and second junctions, respectively, and each having a second terminal coupled to the reference potential.

2. An active band pass filter with variable bandwidth as claimed in claim 1 combined with a plurality of similar active band pass filters to form a higher order active band pass filter, the first differential input of the first amplifier in a first of the plurality of filters being coupled to receive input signals to the filter, the second differential input of the first amplifier in each of the plurality of filters except the final filter being coupled to the first junction of the next filter of the plurality of filters, then the second differential input of the first amplifier to the final filter in the plurality of filters being coupled to the first junction of the final filter.

3. An active bandpass filter with variable bandwidth as claimed in claim 1 wherein the first, second, and third variable gain transconductance amplifiers each include a pair of complimentary input follower circuits having complimentary inputs, an element coupled to each of said follower circuits to provide a signal current in said element in response to a differential input voltage applied to the complimentary inputs of said follower circuits, the signal current in said element producing differential currents in each of said follower circuits, and a multiplier having a pair of input devices, one each coupled into and forming a common component with each of said follower circuits, said input devices sensing the differential current flowing in said follower circuits.

4. An active bandpass filter with variable bandwidth as claimed in claim 1 wherein the first, second, and third variable gain transconductance amplifiers each include:
   a pair of complimentary input follower circuits each including a pair of opposite conductivity transistors with the base of a first transistor of said pair forming a complimentary input, the emitter of the first transistor of the pair being connected to the base of the second transistor, the collector of the first transistor of the pair being connected to a power supply terminal, and the emitter of the first transistor and the collector of the second transistor of the pair being coupled to a reference potential terminal by bias current devices;
   an element coupled to the emitter of the second transistor of the pair in each of said follower circuits to provide a signal current in said element in response to a differential input voltage applied to the complimentary inputs of said follower circuits, the signal current in said element producing differential currents in each of said follower circuits;
   a multiplier including a differential pair of transistors having common connected emitters and a pair of input devices each including a transistor with the bases connected in common, and said input devices one each being coupled into and forming a common component with each of said follower circuits, said input devices sensing the differential current flowing in said follower circuits;
   a first bias current source coupled to the complimentary input follower circuits and a second bias current source coupled to the multiplier, the ratio of said first bias current to said second bias current setting the transconductance gain of the amplifier and one of said current sources being variable to vary the transconductance gain; and
   a bias cell connected to the power supply terminal and the reference potential terminal and coupled to provide the first and second bias current sources and further coupled to the bias current devices of the pairs of input follower circuits.

5. A low supply voltage, high swing input signal, variable gain transconductance amplifier, comprising:
   a pair of complimentary input follower circuits, having complimentary inputs;
   an element coupled to each of said follower circuits to provide a signal current in said element in response to a differential input voltage applied to the complimentary inputs of said follower circuits, said signal current element producing differential currents in each of said follower circuits;
   a multiplier having a pair of input devices, one each coupled into and forming a common component with each of said follower circuits, said input devices sensing the differential current flowing into follower circuits,
   said input devices of said multiplier including a pair of transistors having common connected bases and the multiplier further including a differential pair of transistors having common connected emitters;
   said pair of complimentary input follower circuits including a pair of opposite conductivity transistors connected with the base of a first transistor of said pair forming one of the complimentary inputs, the emitter of the second transistor of said pair being connected to the element, and the emitter of the first transistor being connected to the base of the second transistor; and
   a first biased current source coupled to the complimentary input follower circuits and a second biased current source coupled to the multiplier, said second biased current being variable to vary the transconductive gain of said amplifier, the ratio of the first biased current to the second biased current setting the transconductive gain if the amplifier.

6. A transconductance amplifier as claimed in claim 5 wherein the collector of the first transistor of each of the pairs in the follower circuits is connected to a power supply terminal and the emitter of the first transistor and the collector of the second transistor of each of the pairs in the follower circuits are coupled to a reference potential terminal by bias current devices.

7. A transconductance amplifier as claimed in claim 6 wherein the power supply terminal has approximately a 5 volt power supply attached thereto.

8. A transconductance amplifier as claimed in claim 6 wherein the pair of transistors included in the input devices of the multiplier each have a collector connected to the element and an emitter coupled to the reference potential terminal through separate transistors controlled by the second transistor of the associated follower circuit.

9. A transconductance amplifier as claimed in claim 8 including in addition a bias cell connected to the power supply terminal and the reference potential terminal and coupled to provide the first and second bias current sources and further coupled to the bias current devices.

* * * * *